(12) United States Patent
Chato et al.

(10) Patent No.: US 7,408,141 B2
(45) Date of Patent: Aug. 5, 2008

(54) LIGHT-RECEIVING AMPLIFIER CIRCUIT AND OPTICAL PICK-UP DEVICE USING THE SAME

(75) Inventors: Tetsuo Chato, Osaka (JP); Hiroshi Yamaguchi, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/428,422

(22) Filed: Jul. 3, 2006

(65) Prior Publication Data
US 2007/0018079 A1    Jan. 25, 2007

(30) Foreign Application Priority Data
Jul. 20, 2005    (JP)    ............................. 2005/209751

(51) Int. Cl.
*H01J 40/14*    (2006.01)

(52) U.S. Cl. ............................. 250/214 A; 250/214 LS; 330/308

(58) Field of Classification Search ............. 250/214 A, 250/214 LA, 214 LS, 214 R, 214 AG; 330/308, 330/110, 59
See application file for complete search history.

(56) References Cited
U.S. PATENT DOCUMENTS 5,343,454 A * 8/1994 Watanabe et al. ........ 369/44.32

7,030,702 B2 * 4/2006 Denoyer et al. ............. 330/308
2006/0103472 A1    5/2006 Fukuda et al.

FOREIGN PATENT DOCUMENTS

JP    3123708    10/2000

OTHER PUBLICATIONS an English language Abstract of the corresponding Japanese Laid-Open Patent Publication No. HEI 10-242774, 1998.

* cited by examiner

*Primary Examiner*—Kevin Pyo
(74) *Attorney, Agent, or Firm*—Greenblum & Bernstein, P.L.C.

(57) ABSTRACT

The present invention provides a light-receiving amplifier circuit which includes a clipping circuit, can prevent an oscillation at the time of clipping operation, and can freely set clipping voltage. The light-receiving circuit of the present invention includes a photodiode, an operation amplifier, a conversion resistance connected between an output terminal and an inverting input terminal of the operation amplifier, and a clipping circuit which clips output voltage of the operation amplifier to a predetermined value. The clipping circuit includes a PNP transistor which detects a change in the output voltage of the operation amplifier and a voltage source connected to a base of the PNP transistor. Here, when the PNP transistor is turned ON along with an increase of an emitter potential of the NPN transistor which constitutes an output amplifier stage of the operation amplifier, voltage from the voltage source is applied to the base of the NPN transistor via the PNP transistor.

11 Claims, 3 Drawing Sheets

LIGHT-RECEIVING AMPLIFIER CIRCUIT AND OPTICAL PICK-UP DEVICE USING THE SAME

BACKGROUND OF THE INVENTION (1) Field of the Invention

The present invention relates to a light-receiving amplifier circuit used for a pick-up of an optical disc such as a CD-R and a DVD-R, and to an optical pick-up device using the same.

(2) Description of the Related Art

FIG. 1 shows an example of a light-receiving amplifier circuit used for a pick-up of an optical disc such as a CD-R and a DVD-R indicated in the Patent Reference 1 (Japanese Laid-Open Patent Application No. 3123708). In this structure, a cathode of a photodiode 21, which converts an optical signal into an electric signal, is connected to a supply-voltage terminal 22; an anode is connected to an inverting input terminal of an operation amplifier 23; a conversion resistance 24 is connected between the inverting input terminal and an output of the operation amplifier 23; an emitter of a PNP transistor 25 is connected to the inverting input terminal of the operation amplifier 23; a base is connected to the output; and a collector is connected to a GND.

In such structure, when an optical signal is inputted to the photodiode 21, photocurrent, which is proportional to the intensity of that optical signal, is inputted to the operation amplifier 23; the photocurrent is converted into a voltage signal by the conversion resistance 24; and voltage Vo obtained as a product of photocurrent Iph and a resistance value Rfd of the conversion resistance 24 is outputted.

When the optical input is increased and the product of the photocurrent Iph and the resistance value Rfd becomes greater than a base-emitter voltage VBE of the PNP transistor 25, the PNP transistor 25 starts to be active so as to restrict the output voltage based on the VBE. Furthermore, excess current generated at the photodiode 21 because of the further increase in the photocurrent is emitted to the GND so as to prevent the light-receiving amplifier circuit from being saturated.

SUMMARY OF THE INVENTION

A conventional light-receiving amplifier circuit is structured as described above. With this structure, the output voltage can be clipped simply by connecting a transistor to a photodiode, and the amplifier circuit is not saturated even when a pulse with large amplitude is inputted. Therefore, a high-speed response characteristic can be realized.

However, with such structure, there is a possible case where an apparent resistance value is decreased due to the fact that the photodiode and the conversion resistance are connected to each other in parallel when the output voltage is clipped so that the circuit is oscillated.

Hereinafter, this case shall be described in detail.

FIG. 2 is a diagram showing a frequency characteristic of the operation amplifier shown in FIG. 1. In FIG. 2, a solid line indicates an open-loop gain of the operation amplifier 23 when the transistor 25 is OFF and a dashed line indicates an open-loop gain of the operation amplifier 23 when the transistor 25 is ON. Additionally, in FIG. 2, a chain double-dashed line indicates a phase transition of the output signal.

When the transistor 25 is OFF, the open-loop gain of the operation amplifier 23 is determined based on the resistance value Rfd of the conversion resistance. Herein, the open-loop gain of the operation amplifier 23 shows a characteristic indicated by the solid-line in FIG. 2.

On the other hand, when the transistor 25 is ON, the open-loop gain of the operation amplifier 23 is determined based on a parallel sum of the resistance value Rfd and an ON resistance of the transistor 25. Herein, compared to the case when the transistor 25 is OFF, the gain of the operation amplifier 23 is shifted toward a higher frequency. When the transistor 25 is turned OFF, a phase margin with the open-loop gain of the operation amplifier 23 of 0 dB is significantly decreased from Moff to Mon. As a result, the operation of a feedback circuit becomes unstable and the operation amplifier 23 is oscillated.

The current, which is generated in the case where greater optical signal is inputted after the output voltage is clipped, is supplied from the output current of the circuit. However, the circuit operation becomes unstable and ringing occurs in the output waveform unless this output current becomes large enough. Furthermore, whereas the clipping voltage is determined based on the VBE of the PNP transistor 25, there is a problem that the clipping voltage can be set, to the reference voltage of the amplifier circuit, only based on the VBE fixed to about 0.7V or a voltage of integral multiple of the VBE.

In order to overcome the aforementioned problems, the present invention provides a light-receiving amplifier circuit which can freely set a clipping voltage while preventing a decrease of the conversion resistance value upon clipping the output voltage and an increase of the output current for supplying current to the photodiode, and an optical pick-up device using the light-receiving amplifier circuit.

In order to overcome the aforementioned problems, a light-receiving amplifier circuit of the present invention includes a photodiode which converts an optical signal into a current signal; an operation amplifier circuit which converts and amplifies the current signal into a voltage signal, and outputs the voltage signal; and a clipping circuit which clips the output voltage of the operation amplifier circuit to a predetermined value by clipping an input voltage of an output amplifier stage of the operation amplifier circuit, when the output voltage of the operation amplifier circuit reaches the predetermined value, in which the current signal is converted into the voltage signal through a conversion resistance connected between an output terminal and an inverting input terminal of the operation amplifier circuit.

The clipping circuit includes at least a voltage source and a switch element which detects a change of the output voltage of the operation amplifier circuit, and when turned on, the switch element may apply a voltage in accordance with a voltage of the voltage source to an input of the output amplifier stage of the operation amplifier circuit.

It is desirable that the voltage source is a variable voltage source.

It is desirable for the light-receiving amplifier circuit to further include a current supply circuit which supplies current generated by the photodiode.

It is further desirable that current supply circuit operates in accordance with a voltage clipping operation performed by the clipping circuit.

Specifically, the switch element is a first bipolar transistor; the current supply circuit includes a second bipolar transistor; an emitter of the second bipolar transistor may be connected to an input terminal of the operation amplifier circuit to which the photodiode is connected; a base of the second bipolar transistor may be connected to a collector of the first bipolar transistor; and the voltage source may be connected to the base of the first bipolar transistor.

Furthermore, it is desirable for the light-receiving amplifier circuit to include a plurality of the conversion resistances; and that a conversion resistance switching circuit which selectively connects one of the conversion resistances to the output terminal of the operation amplifier circuit.

It is desirable that clipping circuit clips the input voltage of said output amplifier stage to a different voltage in accordance with switching of the conversion resistances by the conversion resistance switching circuit.

It is desirable that the clipping circuit includes a plurality of voltage sources and a clipping voltage switching circuit which is connected selectively to one of the voltage sources, and that the clipping circuit selects one of the voltage sources in accordance with switching of the conversion resistances by the clipping voltage switching circuit, and clips the input voltage of the output amplifier stage in accordance with the selected voltage.

An optical pick-up device according to the present invention is an optical pick-up device which outputs a voltage in accordance with an intensity of reflected light from an optical disc medium, and includes the aforementioned light-receiving amplifier circuit of the present invention.

Furthermore, in the optical pick-up device, the light-receiving amplifier circuit includes: a plurality of conversion resistances; and a conversion resistance switching circuit which selectively connects one of the conversion resistances to the output terminal of the operation amplifier circuit. Here, it is desirable that the clipping circuit clips the input voltage of the output amplifier stage to a different voltage in accordance with switching of the conversion resistances by the conversion resistance switching circuit; when the optical disc medium is being reproduced, the conversion resistance switching circuit connects one of the conversion resistances to the output terminal of the operation amplifier circuit, and clips the input voltage of the output amplifier stage at a voltage which is high enough to keep the operation amplifier circuit from being saturated; and when the optical disc medium is being recorded, the conversion resistance switching circuit connects one of the conversion resistances, which has a lower resistance value than the conversion resistance connected when the optical disc medium is being reproduced, to the output terminal of the operation amplifier circuit, and clips the input voltage of the output amplifier stage at a voltage which is low enough to allow the operation amplifier circuit to perform normal operation.

Therefore, the clipping circuit includes a plurality of voltage sources and a clipping voltage switching circuit which is connected selectively to one of the voltage sources, and the clipping circuit may select one of the voltage sources in accordance with switching of the conversion resistances by the clipping voltage switching circuit, and clips the input voltage of the output amplifier stage in accordance with the selected voltage.

The present invention can stabilize clipping operation of the output voltage in the light-receiving amplifier circuit and freely set the clipping voltage in accordance with its use so that an optimum operation in accordance with respective use of recording and reproduction of the optical pick-up device can be realized.

As further information about technical background to this application, the disclosure of Japanese Patent Application No. 2005-209751 filed on Jul. 20, 2005 including specification, drawings and claims is incorporated herein by reference in its entirety.

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings.

DESCRIPTION OF THE PREFERRED EMBODIMENT

Hereinafter, it shall be described about an embodiment of the present invention with reference to the drawings.

Figure 1:
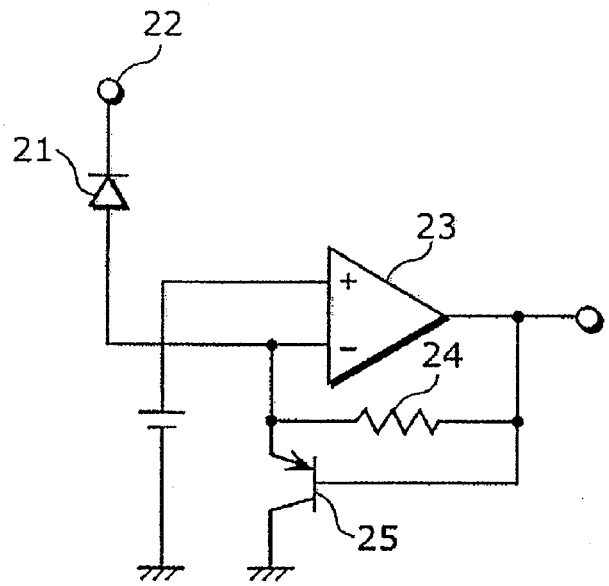
FIG. 1 is a diagram showing a structure of the conventional light-receiving amplifier circuit.
Figure 2:
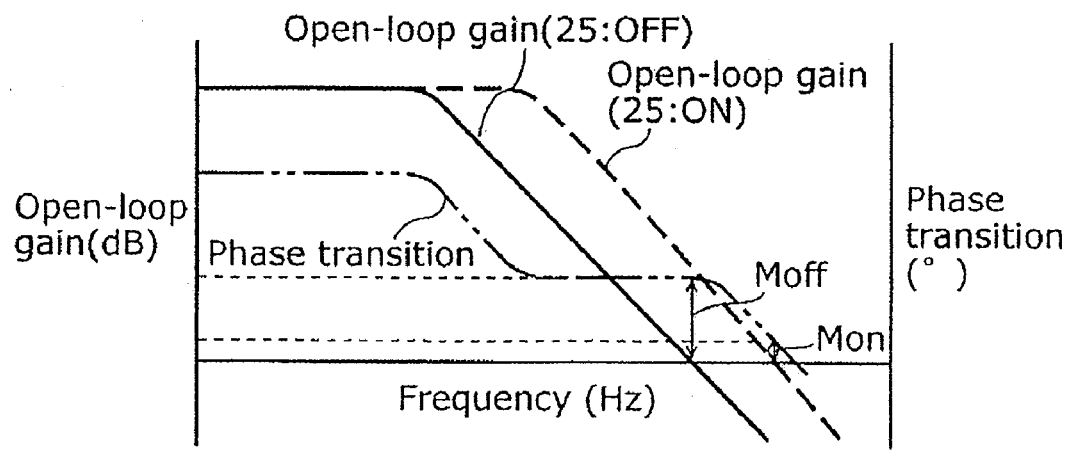
FIG. 2 is a diagram showing frequency characteristics of the light-receiving amplifier circuit shown in FIG. 1.
Figure 3:
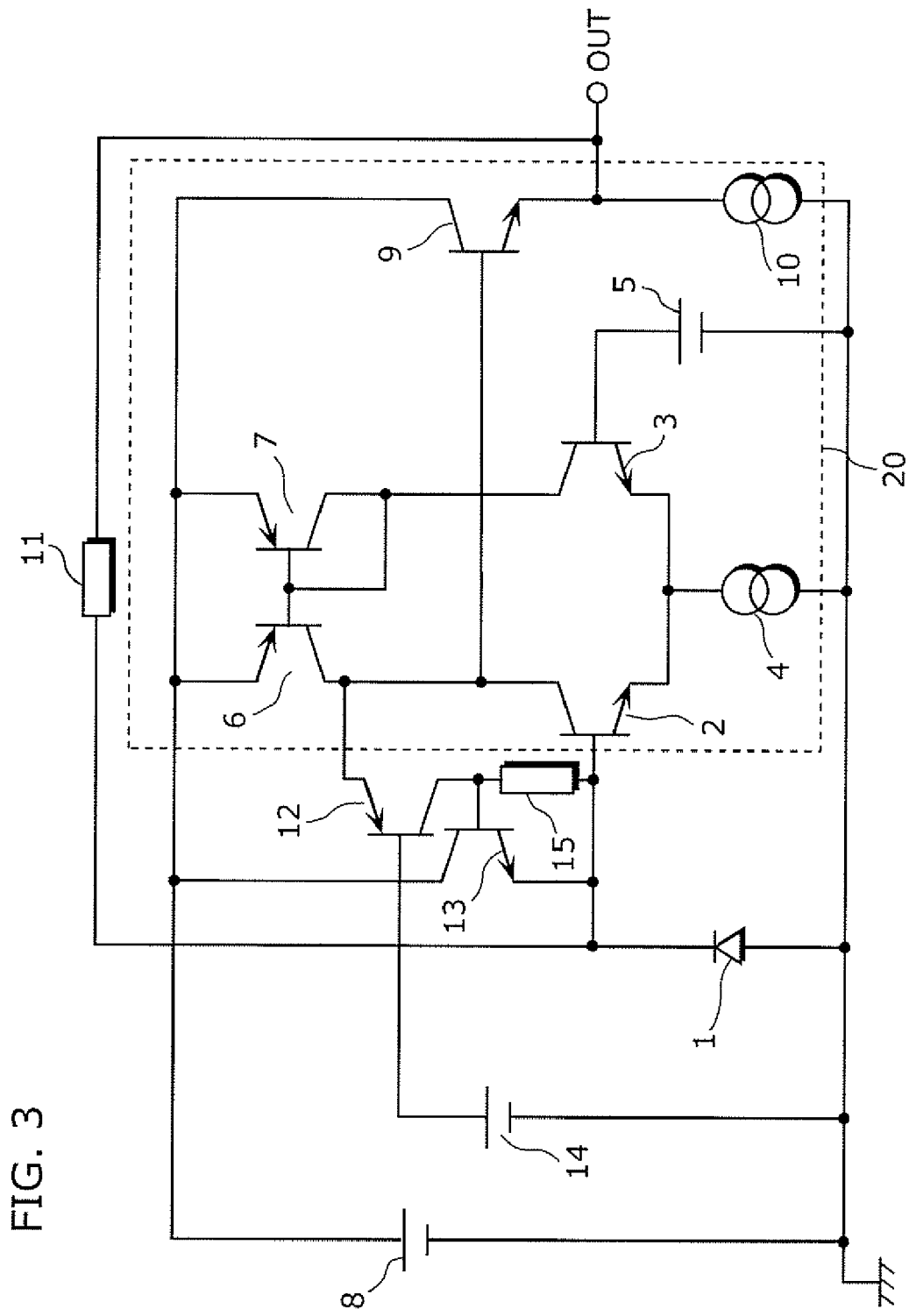
FIG. 3 is a diagram showing a structure of a light-receiving amplifier circuit according to an embodiment of the present invention.

FIG. 3 is a diagram showing a structure of a light-receiving amplifier circuit according to the embodiment of the present invention.

In this structure, an anode of a photodiode 1 is connected to a GND, and a cathode is connected to a base of an NPN transistor 2 that is an inverting input terminal of an operation amplifier 20.

The operation amplifier 20 is made up of: a differential input stage which includes a pair of NPN transistors 2 and 3 and a current source 4; an active load which includes PNP transistors 6 and 7; an NPN transistor 9; a current source 10; and a conversion resistance 11.

Respective emitters of the NPN transistors 2 and 3 are connected to the GND via the current source 4, and the base of the NPN transistor 3 as a reference voltage terminal is connected to the reference voltage source 5.

The base of the PNP transistor 6 is connected to the base and collector of the PNP transistor 7 and to the collector of the NPN transistor 3; the emitter of the PNP transistor 6 is connected to the voltage source 8; and the collector of the PNP transistor 6 is connected to the collector of the NPN transistor 2 and the base of the NPN transistor 9.

Furthermore, a voltage clipping circuit according to the present embodiment is structured as described below.

In the voltage clipping circuit, the emitter of the PNP transistor 12 is connected to the base of the NPN transistor 9; the base of the PNP transistor 12 is connected to the voltage source 14; and the collector of the PNP transistor 12 is connected to the base of the NPN transistor 13 and to the base of the NPN transistor 2 via the resistance 15.

The collector of the NPN transistor 13 is connected to the voltage source 8, and the emitter of the NPN transistor 13 is connected to the cathode of the photodiode 1.

Next, the operation of this circuit shall be described in detail.

A pulse waveform, which makes the amplifier to be instantaneously saturated, is inputted to the photodiode of the photoelectric converter at the time of recording onto an optical disc for recording such as a CD-R, a CD-RW, a DVD-R and a DVD-RW.

This clipping circuit aims to improve a response characteristic by restricting the output voltage of the amplifier before the output voltage reaches a saturation voltage.

When an optical signal is inputted to the photodiode 1, voltage is generated at the output terminal OUT. Here, the voltage is determined as a product of the photocurrent Iph and the resistance value Rfd of the conversion resistance 11. If the optical signal inputted to the photodiode 1 is further increased, a base potential is raised along with an increase of the emitter potential of the NPN transistor 9.

When the base potential of the NPN transistor 9 reaches the potential level which is higher as much as VBE of the PNP transistor 12 than the potential level of the voltage source 14, the PNP transistor 12 is turned ON, and the emitter potential of the transistor 12 is fixed to the value of the product of the voltage of the voltage source 14 and the VBE of the PNP transistor 12.

As a result, the base of the transistor 9 is fixed to the voltage of the voltage source 14 and the VBE of the PNP transistor 12. Assuming that the VBE of the PNP transistor 12 is approximately equal to the VBE of the NPN transistor 9, the output voltage of the amplifier is clipped at the potential of the voltage source 14.

Furthermore, when the PNP transistor 12 is turned ON, current is applied to the resistance 15. Here, when the potentials generated at both sides of the resistance 15 are greater than the VBE of the NPN transistor 13, the NPN transistor 13 is turned ON. Therefore, the voltage source 8 can supply excess current generated by the photodiode 1 through the NPN transistor 13.

According to this embodiment, when the product of the photocurrent Iph and the resistance value Rfd of the conversion resistance 11 reaches the VBE of the PNP transistor 12 of the clipping circuit, the clipping circuit starts to be active and clips the output voltage in accordance with the VBE. Furthermore, even when the clipping circuit is in operation, the resistance value which defines a gain is determined only based on the conversion resistance 11, which is the same result obtained in the case where the clipping circuit does not operate. Therefore, the circuit oscillation can be prevented. Additionally, since it is not necessary to supply, from the operation amplifier 20, excess current generated by the photodiode 1 after the output voltage is clipped, the operation of the operation amplifier 20 can be stabilized. Furthermore, by setting the voltage source 14 as a variable-voltage source, a clipping voltage value can be optimized in accordance with its use and purpose.

Figure 4:
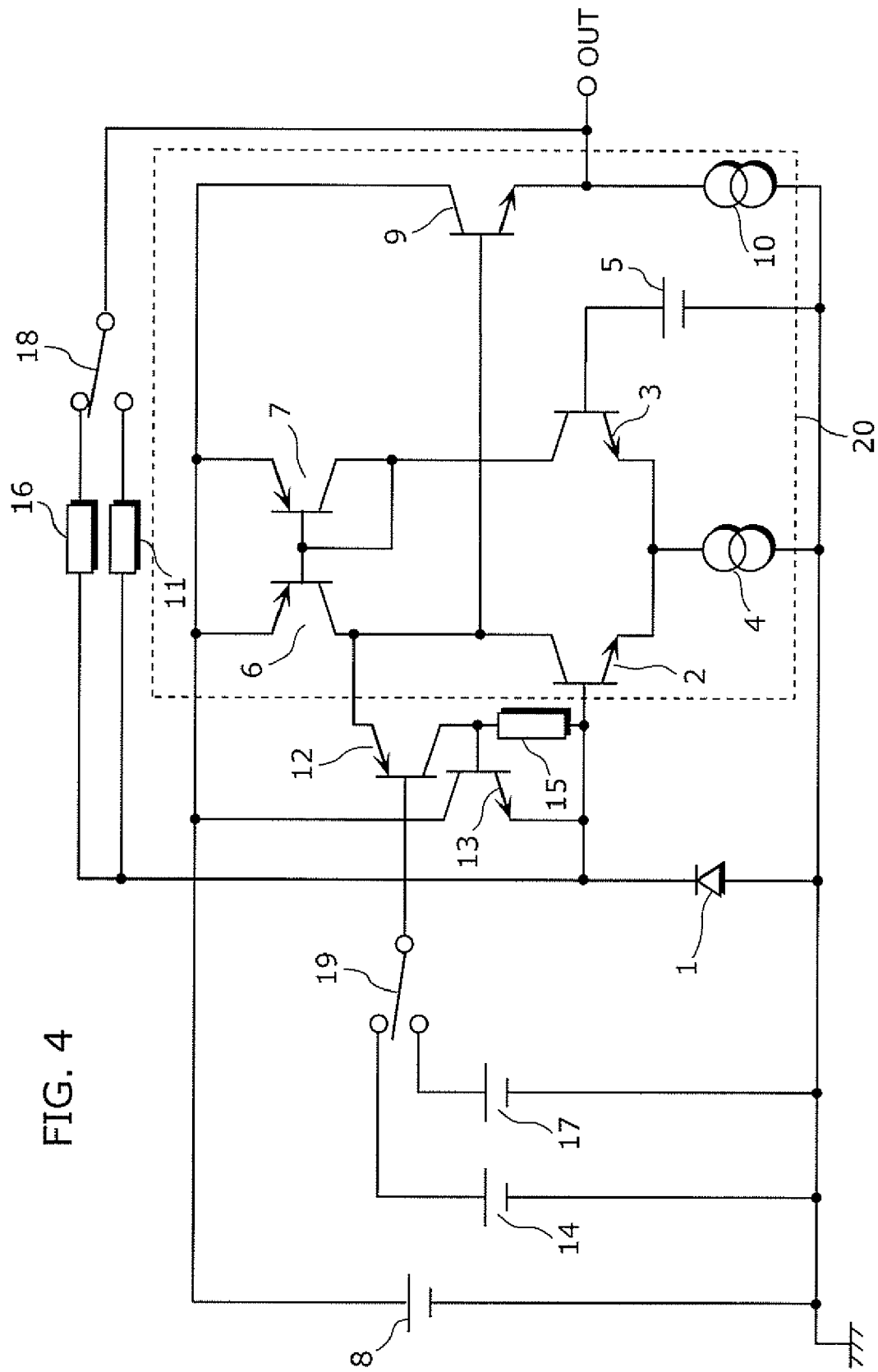
FIG. 4 is a diagram showing a variation of the light-receiving amplifier circuit according to the embodiment of the present invention.

FIG. 4 shows a variation of the present embodiment.

The structure shown in FIG. 4 is different from that shown in FIG. 3 in that a conversion resistance 16 and a conversion resistance 11 having different resistance values are inserted, in parallel, between the base of the NPN transistor 2 and the emitter of the NPN transistor 9 so that one of the conversion resistance 11 and the conversion resistance 16 can be selected by a switch 18 placed on the side of the emitter of the NPN transistor 9, and that a switch 19 is connected to the base of the PNP transistor 12 so that one of a voltage source 14 and a voltage source 17 having different values of voltage can be selected by a switch 19 as a voltage source to be connected to the base of the PNP transistor 12.

In addition to the aforementioned circuit structure, the clipping voltage can be changed in accordance with a different gain by switching with the switch 18 and the switch 19 in a manner that the switch 18 and the switch 19 interact with each other. Therefore, an optimum operation can be realized in accordance with a system and the like which can select an optimum condition for a respective operation performed at the time of recording and reproduction.

For example, when an optical disc is reproduced, photocurrent outputted from the photodiode 1 is very weak so that it is necessary to adjust the output voltage by selecting a higher conversion resistance value using the switch 18. Here, when a higher clipping voltage is selected by the switch 19, it is possible to extend a dynamic range of the output. It should be noted that it is necessary to set clipping voltage which is enough to prevent the output of the operation amplifier 20 from being saturated.

Furthermore, when an optical disc is recorded, photocurrent outputted from the photodiode 1 is large so that it is necessary to adjust the output voltage by selecting a lower conversion resistance value using the switch 18 in order to prevent the operation amplifier 20 to be saturated. Here, when lower clipping voltage is selected by the switch 19, time required for an output response can be shortened. It should be noted that it is necessary to set clipping voltage which is enough to allow a normal operation of the operation amplifier 20.

Note that, whereas plural voltage sources 14 and 17 are used to be selected by the switch 19 in order to change the clipping voltage, only the voltage source 14 may be used as a variable voltage source.

Furthermore, the switches 18 and 19 may be respectively configured of a bipolar transistor or a MOS transistor.

Note that, in the present embodiment, an anode of a photodiode may be connected to an inverting input terminal of the operation amplifier 20. However, in such case, it is necessary to reverse the polarity of the transistor which constitutes an operation amplifier and the like by replacing a differential input stage to a PNP transistor, and the like.

Furthermore, as described in the above, when the light-receiving amplifier circuit of the present embodiment is used in an optical pick-up device, an optimum operation can be realized by changing an output response of the operation amplifier in accordance with respective operations of recording and reproduction. In particular, at the time of recording, a high-speed response to the optical input signal can be realized so that a high-speed recording can be facilitated.

Although only an exemplary embodiment of this invention has been described in detail above, those skilled in the art will readily appreciate that many modifications are possible in the exemplary embodiment without materially departing from the novel teachings and advantages of this invention. Accordingly, all such modifications are intended to be included within the scope of this invention.

INDUSTRIAL APPLICABILITY

The light-receiving amplifier circuit according to the present invention can realize high-speed response to the optical input with large amplitude generated at the photodiode, while preventing the operation amplifier to be saturated. Therefore, it is useful for an optical pick up device which performs recording and reproduction on a medium such as a CD-R, a CD-RW, a DVD-R, a DVD-RW, and a Blu-ray.

What is claimed is:

1. A light-receiving amplifier circuit comprising:
a photodiode which converts an optical signal into a current signal;
an operation amplifier circuit which converts and amplifies the current signal into a voltage signal, and outputs the voltage signal; and
a clipping circuit which clips the voltage signal outputted by said operation amplifier circuit to a predetermined value by clipping an input voltage of an output amplifier stage of said operation amplifier circuit, when the voltage signal outputted by said operation amplifier circuit reaches the predetermined value,
wherein the current signal is converted into the voltage signal through a conversion resistance connected between an output terminal and an inverting input terminal of said operation amplifier circuit, wherein said clipping circuit includes a voltage source and a switch element which detects a change of the voltage signal outputted by said operation amplifier circuit, and when turned on, said switch element applies a voltage in accordance with a voltage of said voltage source to an input of said output amplifier stage of said operation amplifier circuit.

2. The light-receiving amplifier circuit according to claim 1,
wherein said voltage source is a variable voltage source.

3. The light-receiving amplifier circuit according to claim 1, further comprising
a current supply circuit which supplies current generated by said photodiode.

4. The light-receiving amplifier circuit according to claim 3,
wherein said current supply circuit operates in accordance with a voltage clipping operation performed by said clipping circuit.

5. The light-receiving amplifier circuit according to claim 4,
wherein said switch element is a first bipolar transistor,
said current supply circuit includes a second bipolar transistor,
an emitter of said second bipolar transistor is connected to an input terminal of said operation amplifier circuit to which said photodiode is connected,
a base of said second bipolar transistor is connected to a collector of said first bipolar transistor, and
said voltage source is connected to a base of said first bipolar transistor.

6. The light-receiving amplifier circuit according to claim 1, comprising:
a plurality of conversion resistances; and
a conversion resistance switching circuit which selectively connects one of said conversion resistances to the output terminal of said operation amplifier circuit.

7. The light-receiving amplifier circuit according to claim 6,
wherein said clipping circuit clips the input voltage of said output amplifier stage to a different voltage in accordance with switching of said conversion resistances by said conversion resistance switching circuit.

8. The light-receiving amplifier circuit according to claim 7,
wherein said clipping circuit includes a plurality of voltage sources and a clipping voltage switching circuit which is connected selectively to one of said voltage sources, and
said clipping circuit selects one of said voltage sources in accordance with switching of said conversion resistances by said clipping voltage switching circuit, and clips the input voltage of said output amplifier stage in accordance with the selected voltage.

9. An optical pick-up device which outputs a voltage in accordance with an intensity of reflected light from an optical disc medium, comprising:
a light-receiving amplifier circuit comprising
a photodiode which converts an optical signal into a current signal;
an operation amplifier circuit which converts and amplifies the current signal into a voltage signal, and outputs the voltage signal;
a clipping circuit which clips the voltage signal outputted by said operation amplifier circuit to a predetermined value by clipping an input voltage of an output amplifier stage of said operation amplifier circuit, when the voltage signal outputted by said operation amplifier circuit reaches the predetermined value;
a plurality of conversion resistances; and
a conversion resistance switching circuit which selectively connects one of said conversion resistances to an output terminal of said operation amplifier circuit,
wherein the current signal is converted into the voltage signal through a conversion resistance connected between the output terminal and an inverting input terminal of said operation amplifier circuit,
said clipping circuit clips the input voltage of said output amplifier stage to a different voltage in accordance with switching of said conversion resistances by said conversion resistance switching circuit,
when the optical disc medium is being reproduced, said conversion resistance switching circuit connects one of said conversion resistances to the output terminal of said operation amplifier circuit, and clips the input voltage of said output amplifier stage at a voltage which is high enough to keep said operation amplifier circuit from being saturated, and
when the optical disc medium is being recorded, said conversion resistance switching circuit connects one of said conversion resistances, which has a lower resistance value than said conversion resistance connected when the optical disc medium is being reproduced, to the output terminal of said operation amplifier circuit, and clips the input voltage of said output amplifier stage at a voltage which is low enough to allow said operation amplifier circuit to perform normal operation.

10. The optical pick-up device according to claim 9,
wherein said clipping circuit includes a plurality of voltage sources and a clipping voltage switching circuit which is connected selectively to one of said voltage sources, and
said clipping circuit selects one of said voltage sources in accordance with switching of said conversion resistances by said clipping voltage switching circuit, and clips the input voltage of said output amplifier stage in accordance with the selected voltage.

11. A light-receiving amplifier circuit comprising:
a photodiode which converts an optical signal into a current signal;
an operation amplifier circuit which converts and amplifies the current signal into a voltage signal, and outputs the voltage signal, said operation amplifier circuit comprising a first transistor connected to an output of the operation amplifier circuit;
a clipping circuit which clips the voltage signal outputted by said operation amplifier circuit to a predetermined value by clipping an input voltage of an output amplifier stage of said operation amplifier circuit, when the voltage signal outputted by said operation amplifier circuit reaches the predetermined value, said clipping circuit comprising a second transistor connected to a base of the first transistor;
a plurality of conversion resistances; and
a conversion resistance switching circuit which selectively connects one of said conversion resistances to an output terminal of said operation amplifier circuit,
wherein the current signal is converted into the voltage signal through a conversion resistance connected between the output terminal and an inverting input terminal of said operation amplifier circuit,
said clipping circuit clips the input voltage of said output amplifier stage to a different voltage in accordance with switching of said conversion resistances by said conversion resistance switching circuit, said clipping circuit includes a plurality of voltage sources and a clipping voltage switching circuit which is connected selectively to one of said voltage sources, and
said clipping circuit selects one of said voltage sources in accordance with switching of said conversion resistances by said clipping voltage switching circuit, and clips the input voltage of said output amplifier stage in accordance with the selected voltage.

* * * * *